United States Patent [19]

Aigo

[11] Patent Number: 4,907,349
[45] Date of Patent: Mar. 13, 1990

[54] SPIN DRIER FOR SEMICONDUCTOR MATERIALS

[76] Inventor: Seiichiro Aigo, 3-15-13, Negishi, Daito-ku, Tokyo, Japan

[21] Appl. No.: 207,504

[22] Filed: Jun. 16, 1988

[30] Foreign Application Priority Data

Jun. 23, 1987 [JP] Japan .............................. 62-96440[U]

[51] Int. Cl.⁴ ............................................. F26B 17/30
[52] U.S. Cl. .......................................... 34/58; 34/184
[58] Field of Search .......................... 34/58, 59, 8, 184

[56] References Cited

U.S. PATENT DOCUMENTS

| | | | |
|---|---|---|---|
| 4,525,938 | 7/1985 | Aigo | 34/58 |
| 4,677,759 | 7/1987 | Inamura | 34/8 X |
| 4,777,732 | 10/1988 | Hirano | 34/58 X |

Primary Examiner—Henry A. Bennet
Assistant Examiner—John Sollecito
Attorney, Agent, or Firm—Wegner & Bretschneider

[57] ABSTRACT

A spin drier is disclosed, which comprises a casing and a rotor to be rotated in the casing for spin-drying semiconductor materials. The rotor includes a plurality of predetermined areas in which a carrier housing the materials to be dried is set with a cradle. There are provided at each of the areas in the rotor at least one pair of opposed holder rods with their free ends adjacent to each other and vertical stopper rods relevant to the holder rods. Each holder rod is reinforced by the stopper rod and receives in the vicinity of its free end a leg portion of the carrier in which semiconductor materials are housed. Also, each holder rod in the vicinity of other secured end thereof is adapted to be engaged with a portion of the cradle, to thereby hold securely both the carrier and the cradle.

8 Claims, 5 Drawing Sheets

SPIN DRIER FOR SEMICONDUCTOR MATERIALS

BACKGROUND OF THE INVENTION (1) Field of the Invention

This invention relates to an improvement in or relating spin drier to remove water droplets stuck on surfaces of semiconductor materials by centrifugal force and to dry same.

(2) Description of the Prior Art

This kind of spin drier comprises a casing and a rotor rotated in the casing, and the rotor has a plurality of air guides mounted on the base plate of the rotor. Semiconductor materials, usually called wafers, to be dried are housed in a carrier, the carrier being in turn housed in a cradle to be set in a predetermined area between the air guides in the rotor. There is provided a lid on the casing, which lid is positioned above the rotor and has a suction port formed therein. The casing has an exhaust port at a suitable position of its peripheral wall. Centrifugal force due to rotation of the rotor will scatter away and remove water droplets stuck on wafer surfaces, and wafers are dried by air stream introduced through the suction port due to negative air pressure in the central zone in the rotor, then the air stream flowing through wafers housed in the carrier along the peripheral wall of the casing and finally to the exhaust port.

In commonly accepted technique for supporting a carrier for wafers, for example as seen in FIGS. 10 and 11, while a cradle for housing a carrier has a port in its bottom wall through which air flows out, the carrier is housed in the cradle with a pair of carrier's legs engaging against both sides of the cradle bottom wall. This brings about the drawbacks mentioned below.

Since most of air passing through the carrier flows radially outward and thus perpendicularly to the cradle bottom wall, as seen in FIG. 11, a portion of the air flow impinges against the cradle bottom wall and splashes back, then flowing out, which results in vibrations and unstable behaviors on wafers in the carrier. Accordingly, this restricts the rotary speed of the rotor, and due to vibrations the carrier will suffer from minute cracks and being ground off at its groove-edges. Thus resulted minute particles will bring dusts which lead to a stain.

SUMMARY OF THE INVENTION

Therefore, an object of the invention is to solve the aforementioned drawbacks and problems of the prior art and thus to provide an improved spin drier in which the rotor is driven in stable behaviors without any splashing back of air flowing through a carrier.

A spin drier according to our invention comprising a casing and a rotor in the casing is featured by that at each area in the rotor for positioning a carrier with a cradle, at least a pair of opposed holder rods with their free ends adjacent each other are provided in parallel with the base plate of the rotor and stopper rods are secured perpendicularly to the base plate of the rotor in contact with the holder rod to support a radially outward force applied on the holder rod. Each holder rod has a receiver portion near the free end thereof for receiving a leg portion of the carrier housed in the cradle, and is adapted to be engaged with a portion of the cradle in the vicinity of the secured end opposed the free end thereof. This effects to hold securely both the carrier and the cradle and needs no bottom wall of the cradle which engages the carrier's leg portions.

DETAILED DESCRIPTION OF THE INVENTION AND THE PREFERRED EMBODIMENTS

Figure 2:
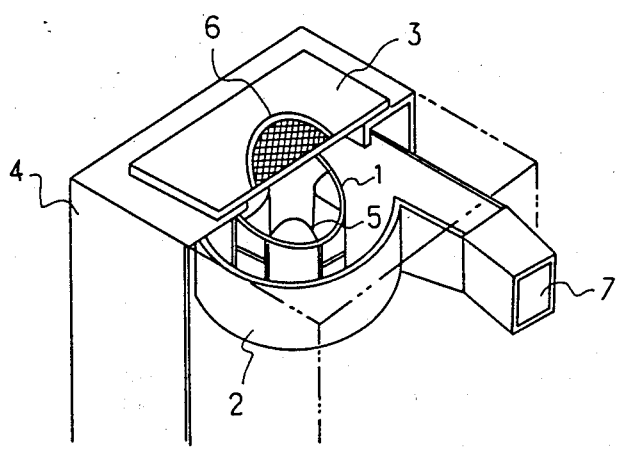
FIG. 2 is a perspective view showing the whole of a spin drier.
Figure 3:
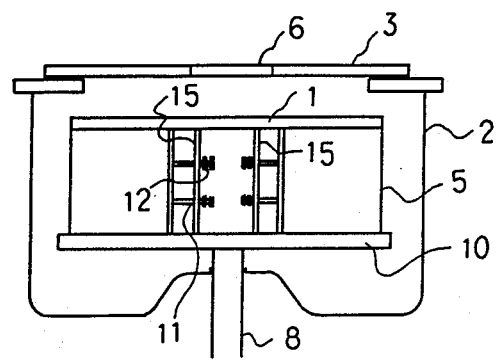
FIG. 3 is a simplified vertical sectional view of a spin drier.

The invention will now be described with reference to the preferred embodiments. In FIGS. 2 and 3 which show the entire structure of the spin drier, numeral 1 denotes a rotor and 2 denotes a casing surrounding the rotor 1. A movable lid 3 is disposed on the casing 2 and above the rotor 1. These members are housed in outer case 4. Air guides 5 are mounted on the base plate 10 of the rotor. Carriers in which wafers are housed are set in predetermined areas between air guides 5 on the rotor by means of a cradle 20. A carrier 25 is housed in a cradle 20 and set in position in rotor 1 with the cradle 20. Preferably, there are four air guides 5 on the base plate 10 as shown and thus four cradles are to be set in the rotor 1. Air guide 5 is usually formed of a right angled, curved plate.

The lid 3 has a suction port 6 formed at the central area thereof, and the port 6 is provided with an air filter. The peripheral wall of the casing 2 has an exhaust port 7 at a suitable position thereof. Air is introduced through the suction port 6 due to the rotation of the rotor 1 into the rotor 1 and casing 2, and flows through and along the interior of the casing 2, then flowing out through the exhaust port 7. As shown in FIG. 3, the base plate 10 of the rotor 1 is coupled at the center thereof with a shaft 8 which is driven by an electric motor or the like. As for the bottom plate of the casing 2, its central area through which the shaft 8 extends is higher than its peripheral area.

Figure 1:
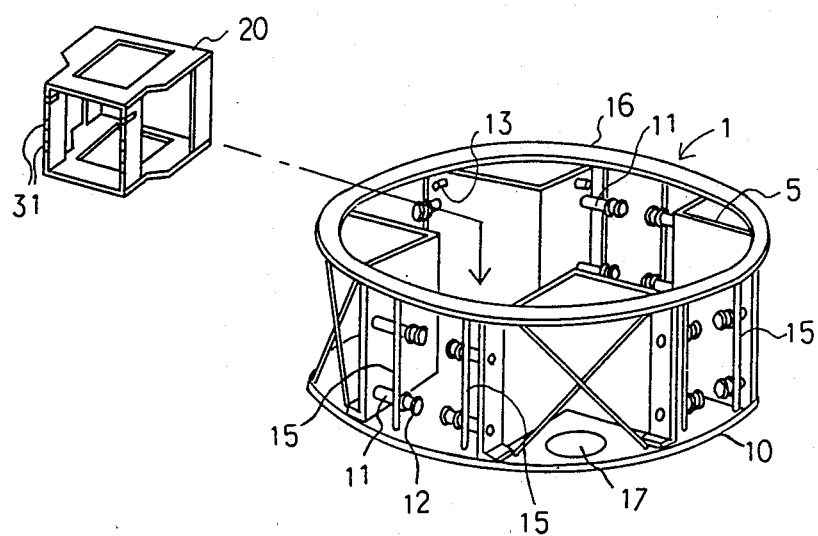
FIG. 1 is a perspective view of a rotor as an example used for a spin drier according to the invention.

The feature of the spin drier according to the invention is to provide at least one pair, preferably as shown in FIG. 1 two pairs of opposed holder rods 11 at each area for setting a carrier between the air guides 5, at the peripheral portion of the rotor 1, in order to hold securely the carrier 25 for wafers as well as the cradle 20. Each pair of holder rods 11 are spaced each other in longitudinal direction thereof, and disposed in parallel with the base plate 10 of the rotor 1. Accordingly, each holder rod 11 is horizontal and is secured at one end thereof.

Figure 4:
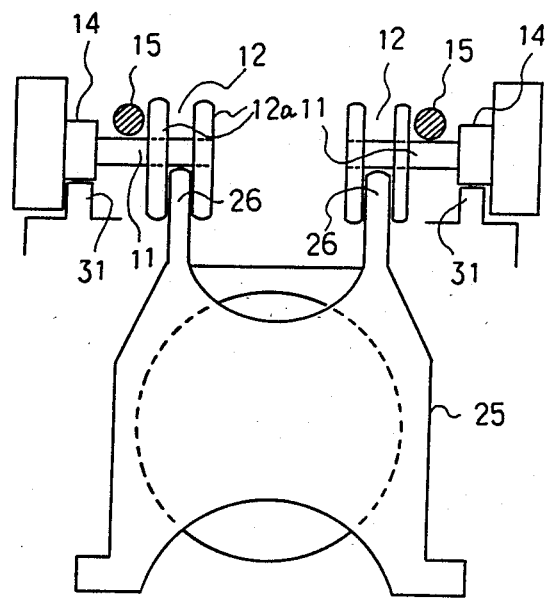
FIG. 4 is a partial plan view showing a carrier and a portion of the rotor.
Figure 5:
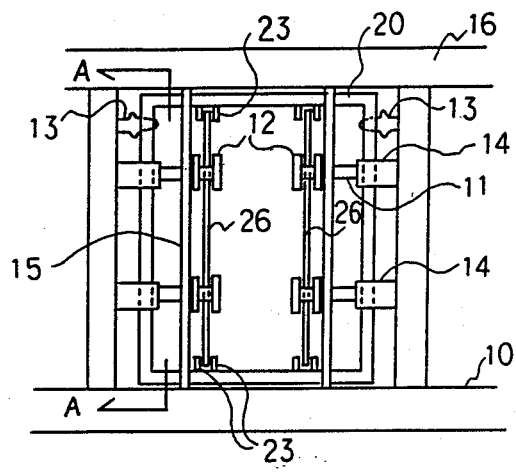
FIG. 5 is a side elevational view showing a portion of the rotor seen from outside.

Each holder rod 11 has a receiver portion 12 in the vicinity of the free end thereof, the free ends of the pair of holder rods 11 being adjacent to each other. The receiver portion 12 is adapted to receive a leg portion 26 of carrier 26 when the carrier is set in position with a cradle 20 as shown in FIGS. 4 and 5. While the receiver portion 12 is desirably composed of a pair of collars 12a as shown in view of easy formation, it will be of other member or constitution as far as the carrier leg portion can be received.

Figure 6:
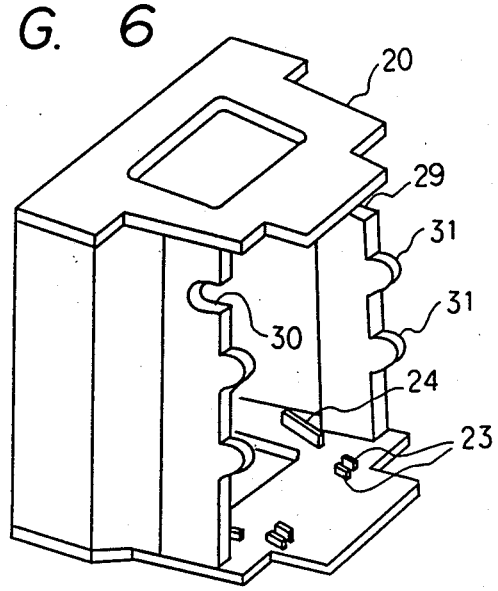
FIG. 6 is a perspective view of a cradle used in our spin drier.
Figure 7:
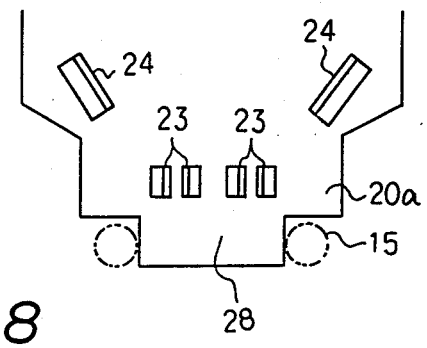
FIG. 7 is a partial plan view showing an end wall of the cradle.
Figure 8:
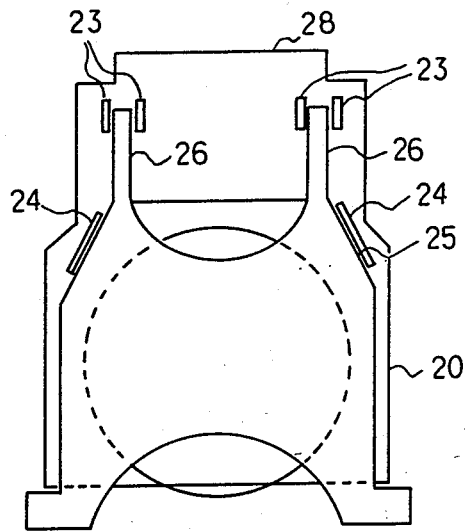
FIG. 8 is a plan view showing a carrier housed in the cradle set in the rotor.

Preferably, as shown in FIGS. 5 and 6, both end walls 20a of the cradle 20 are provided respectively with two pairs of projections 23 in order that both ends of each leg portion 26 are received between a pair of projections 23. These projections 23 will be integrally formed by press-forming. When the cradle is set in position on the rotor 1, the described end walls are disposed in parallel with the base plate 10. Also, the end wall 20a of the cradle 20 is preferably formed with guide pieces 24 opposedly disposed as shown in FIGS. 6 and 7 for guiding a carrier 25 which is being introduced. The cradle 20 has a positioning groove 30 on both sides, said groove 30 being engaged with a pin 13 mounted on the air guide 5.

Figure 9:
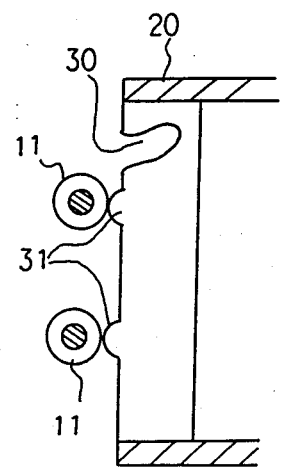
FIG. 9 is a section taken along line A—A in FIG. 5.

Furthermore, as shown in FIG. 6, the cradle 20 has other projections 31 at the bottom thereof which is positioned outward in the rotor 1. These projections 31 are adapted to engage with a portion of the holder rod 11 in the vicinity of the secured end of the rod 11, namely remote from the receiver portion 12 as shown in FIGS. 4 and 9. Otherwise, we will employ a projecting edge or stepped portion instead of the projection 31.

As seen in FIGS. 1, 3 and 5, the rotor 1 includes stopper rods 15 secured perpendicularly to the base plate 10 of the rotor 1 in contact with the holder rod 11 in the vicinity of the receiver portion 12. The stopper rods 15 are attached between the rotor 1 and upper ring 16 disposed above the rotor 1. These stopper rods 15 serve to support a radially outward force applied on the holder rod 11. Preferably, as shown in FIG. 7, end wall 20a of the cradle is provided with a projected portion 28 which is to be received between the stopper rods 15, so as to support a circumferential force by the abutment of the portion 28 with the stopper rods.

Also, as shown in FIG. 1, in order to reduce the weight of the rotor and to promote air flow through the rotor, the base plate 10 is desirably formed with openings 17 through which air flows. These openings are formed at areas surrounded by the air guides 5.

Thus, the cradle 20 is held in position both by engagement of the projections 31 with holder rods 11 and by engagement of the grooves 30 with pins 13. The carrier 25 is also held in position both by engagement of leg portions 26 with receiver portions 12 of holder rods 11 and by engagement of ends of the leg portions with projections 23 of the cradle end walls 20a.

Figure 10:
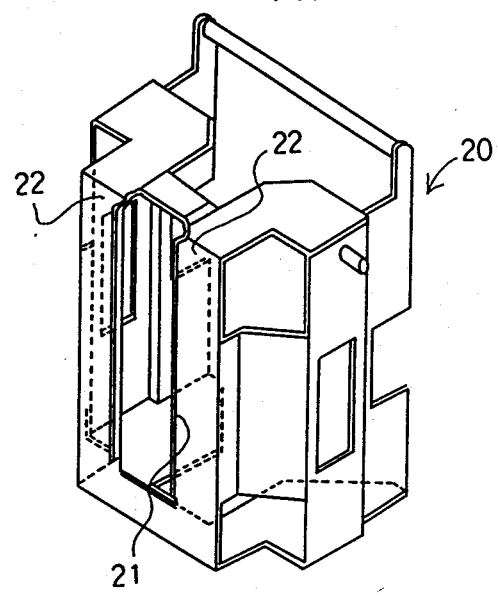
FIG. 10 is a perspective view showing a prior art cradle.
Figure 11:
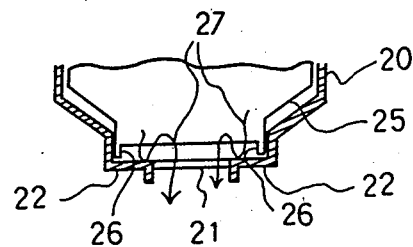
FIG. 11 is a partial sectional view showing a section of a prior art cradle with a carrier housed therein.

For spin-drying wafers in this spin drier, wafers to be dried are housed in a carrier 25, and next the carrier is in turn housed in a cradle 20 to thereby be set in position in the rotor 1. Then, the lid 3 is shifted to close position, and the rotor will be driven. Water droplets stuck on wafers are scattered away therefrom due to the starting acceleration, namely by centrifugal force at starting. The central zone in rotor 1 forms a lower pressure due to the rotation. Thus, air will be drawn into the rotor. Air introduced through suction port 6 flows radially outwards through cradle 20. Then, the cradle 20 used in the spin drier requires no bottom walls hindering the radially outward air flow. Therefore, although a cradle in prior art shown in FIGS. 10 and 11 has bottom wall 22 formed with a port 21, said bottom wall 22 being engaged with carrier's leg portion 26, hindering such outward air flow and causing air splashing back 27 (FIG. 11) as mentioned previously, our cradle 20 does not require such a bottom wall, because the carrier is held securely by the holder rods 11. This improves the outward air flow through the cradle and the carrier. Air past through the cradle 20 flows along the peripheral wall of the casing 2 and is discharged through the exhaust port 7. Such air flow drys wafers set in the carrier 25.

Thus, according to our invention, the rotor is driven in stable behaviors without any splashing back of air flowing through the carrier. This facilitates high speed rotation of the rotor without any vibrations.

Having now fully described the invention, it will be apparent to one of ordinary skill in the art that many changes and modifications can be made thereto without departing from the spirit or scope of the invention as set forth herein.

What is claimed is:

1. In a spin drier for semiconductor materials, which comprises a casing, a rotor to be rotated in the casing and air guides formed of a curved plate, said air guides mounted on the base plate of the rotor, carriers in which semiconductor materials to be dried are housed being adapted to be set in predetermined areas between the air guides with a cradle in which said carrier is housed, the improvement wherein at each said predetermined area in the rotor at least a pair of opposed holder rods with their free ends adjacent to each other are provided in parallel with the base plate of the rotor and stopper rods are secured perpendicularly to the base plate of the rotor in contact with the holder rod to support a radially outward force applied on the holder rod, each holder rod having a receiver portion in the vicinity of the free end thereof for receiving a leg portion of the carrier housed in the cradle, and also each holder rod being adapted to be engaged with a portion of the cradle in the vicinity of the other secured end of the holder rod, to thereby hold securely both the carrier and the cradle.

2. A spin drier for semiconductor materials set forth in claim 1, wherein a pair of the holder rods are disposed in the same vertical position.

3. A spin drier for semiconductor materials set forth in claim 1, wherein two pairs of the holder rods are provided at each said predetermined area in the rotor.

4. A spin drier for semiconductor materials set forth in claim 1, wherein both ends of a pair of leg portions of the carrier are engaged with a pair of projections formed on end walls of the cradle.

5. A spin drier for semiconductor materials set forth in claim 1, wherein said receiver portion of the holder rod is consisted of a pair of collars mounted on the holder rod.

6. A spin drier for semiconductor materials set forth in claim 1, wherein said portion of the cradle to be engaged with the holder rod is a projection or a projecting edge.

7. A spin drier for semiconductor materials set forth in claim 1, wherein the rotor has four said air guides mounted thereon and two or four said predetermined areas.

8. A spin drier for semiconductor materials set forth in claim 1, wherein each part of the base plate of the rotor surrounded by the air guide is formed with an opening through which air flows.

* * * * *